United States Patent [19]
Milkovic

[11] 4,414,510
[45] Nov. 8, 1983

[54] LOW COST SENSING SYSTEM AND METHOD EMPLOYING ANISTROPIC MAGNETO-RESISTIVE FERRITE MEMBER

[75] Inventor: Miran Milkovic, Scotia, N.Y.

[73] Assignee: General Electric Company, Somersworth, N.H.

[21] Appl. No.: 153,886

[22] Filed: May 28, 1980

[51] Int. Cl.³ .................... G01R 33/06; H01L 43/10
[52] U.S. Cl. ............................. 324/252; 338/32 R
[58] Field of Search ............... 324/252, 235, 117 R; 323/93 R, 368, 294; 338/32 R; 252/62.51, 62.56, 62.62

[56] References Cited

U.S. PATENT DOCUMENTS

| | | | |
|---|---|---|---|
| 2,946,955 | 7/1960 | Kuhrt | 324/252 |
| 2,997,948 | 8/1961 | Bozorth | 338/32 R |
| 3,493,694 | 2/1970 | Hunt | 324/252 |
| 3,716,718 | 2/1973 | Almasi et al. | 324/252 |
| 3,848,217 | 11/1974 | Lazzari | 324/252 |

Primary Examiner—Gerard R. Strecker
Assistant Examiner—Walter E. Snow
Attorney, Agent, or Firm—Robert E. Brunson

[57] ABSTRACT

A sensor comprising a member of ferromagnetic ferrite material having anistropic magneto-resistive properties wherein the resistivity characteristics of the ferrite member vary in response to variations in strength of a magnetic field applied longitudinally with respect to a selected longitudinal axis of the ferrite member. A magnetic field is impressed across the ferrite member with the magnetic lines of flux extending along the longitudinal axis of the ferrite member which exhibits variable magneto-resistive properties. A flow of electric current through the ferrite member along a current path that extends in the same direction or opposite to the direction of the magnetic lines of flux and changes in the value of the electric current flow through the ferrite member are measured as an indication of the value of a physical phenomena being sensed by the sensor.

32 Claims, 12 Drawing Figures

$I_A = I_0(1 + KB^\alpha)$

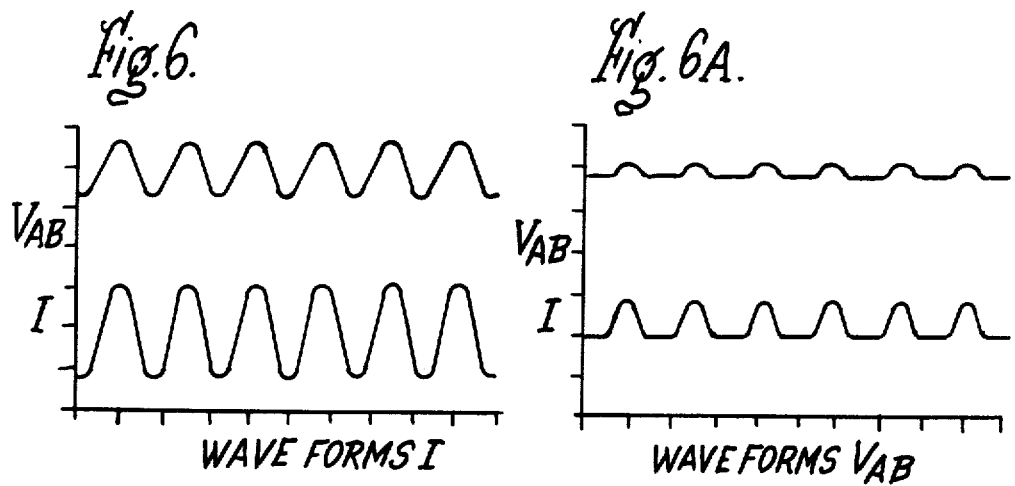
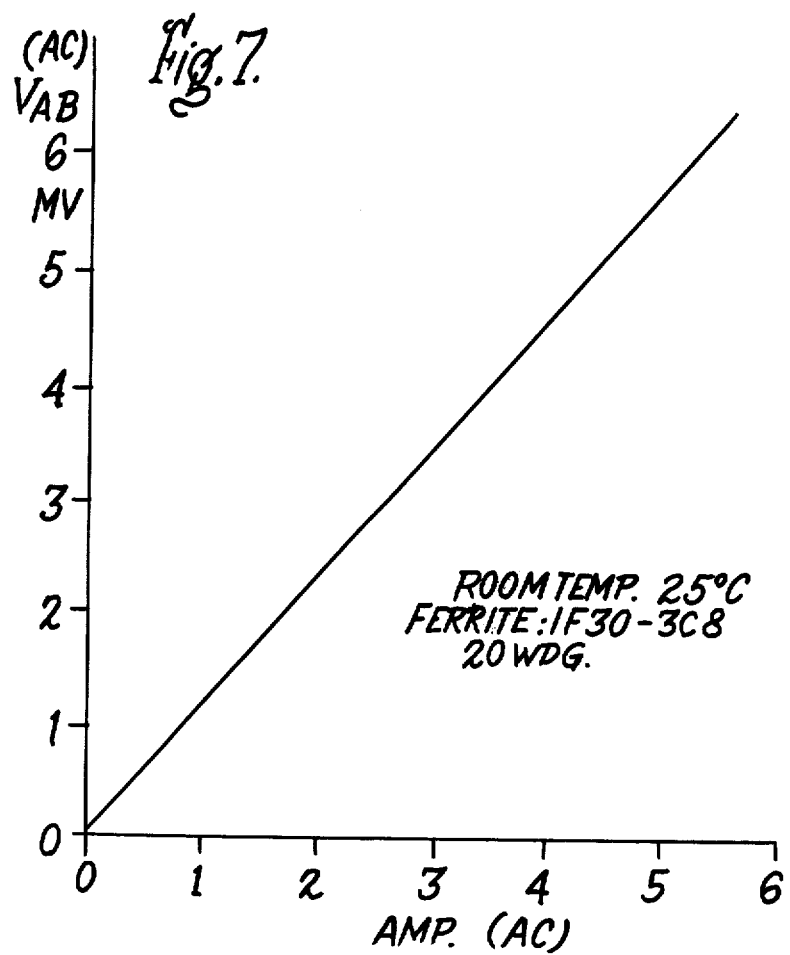

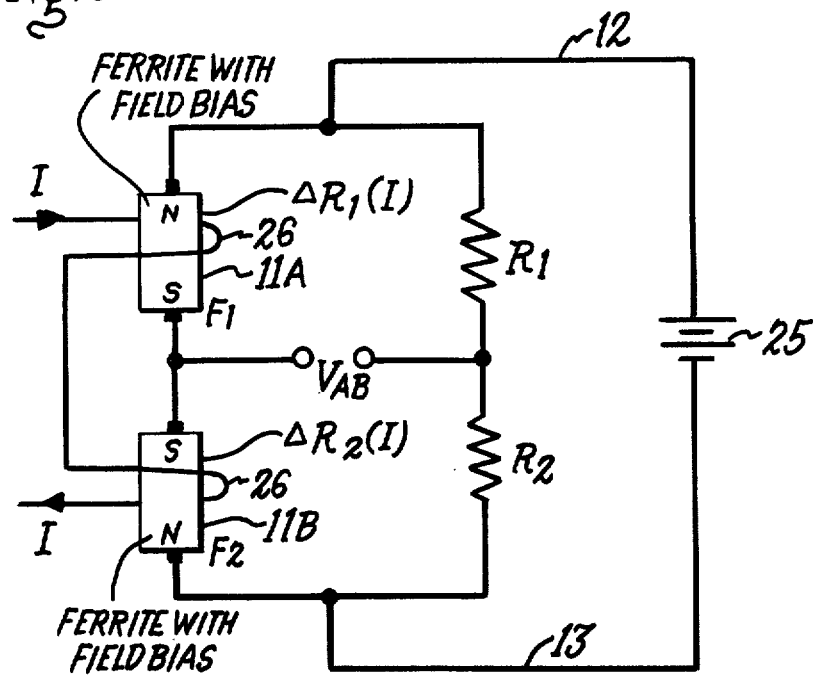
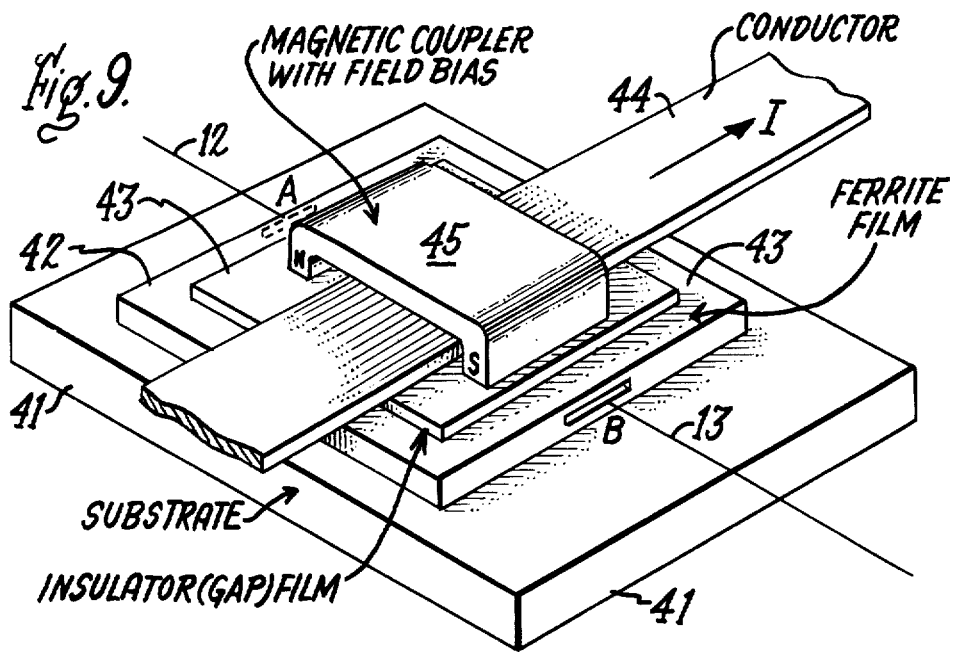

LOW COST SENSING SYSTEM AND METHOD EMPLOYING ANISTROPIC MAGNETO-RESISTIVE FERRITE MEMBER

BACKGROUND OF THE INVENTION

1. Field of the Invention

This invention relates to low cost sensors and sensing systems and methods for sensing physical phenomena such as electric current and voltage values, magnetic fields and the like.

More particularly, the invention relates to low cost sensors and sensing systems of the abovenoted type which employ ferrite sensors that exhibit anistropic magneto-resistive effects.

2. Background Problem

There is a large demand for low cost systems and devices for measuring physical phenomena such as electric current and voltage values, magnetic field strengths and the like. For example, considering the number of residential dwellings in the mainland U.S.A. it will be appreciated that in order to monitor electric power consumption reliably and accurately in each of the residences, requires a substantial investment in measuring instruments known as watthour meters. Each of these instruments requires a sensor device for sensing the value of electric current supplied to the residence as well as a sensor for sensing the voltage at which such electric current is supplied. It will be appreciated therefore that in the case of electric utilities which normally provide such measuring instruments, the capital investment involved in installing and maintaining the instruments is substantial. If new sensing techniques, systems and devices can be devised which will reduce the cost of the measuring instruments even slightly, a substantial savings can be effected.

SUMMARY OF THE INVENTION

It is therefore a primary object of the invention to provide new and improved, low cost, current and voltage sensors and magnetic field strength sensors usable in a variety of different instruments for measuring physical phenomena such as electric current and voltage values and the like. In practicing the invention, the anistropic, magneto-resistive effect possessed by certain ferrite materials can be employed in the sensing of alternating current and direct current voltage and current values and magnetic fields in general. A particular advantage obtained by the provision of the family of low cost current and voltage sensors made available by the invention is that such sensors can be designed to take advantage of magnetic thin film fabrication techniques which in turn may be readily incorporated into low unit cost, high speed production line manufacturing methods and installations.

Sensors constructed according to the invention operate by applying a longitudinal magnetic field to a ferrite member under conditions where the magnetic flux lines of the magnetic field and the current flow lines of an electric current are in the same or in the opposite direction. A drop of the DC resistance of the ferrite member in the order of about 1% is observed for magnetic flux densities of 2 kilogauss (0.2 Wb/m$^2$).

In practicing the invention, a sensor employing the method according to the invention comprises a member of ferromagnetic ferrite material having anistropic magneto-resistive properties wherein the resistivity characteristics of the ferrite member vary in response to variations in the strength of a magnetic field applied longitudinally with respect to a selected longitudinal axis of the ferrite member. The sensor further includes magnetic field producing means for impressing a magnetic field on the ferrite member with the magnetic lines of flux extending along a longitudinal axis of the ferrite member which exhibits variable magneto-resistive properties. The sensor further includes a means for causing a flow of electric current through the said longitudinal axis of the ferrite member along a current path that extends in the same direction, or in the opposite direction of the magnetic lines of flux. An output circuit is coupled to measure the changes in value of the electric current flow through the ferrite member as an indication of the value of a physical phenomenon being measured.

BRIEF DESCRIPTION OF THE DRAWINGS

These and other objects, features and many of the attendant advantages of this invention will become better understood from a reading of the following detailed description when considered in conjunction with the accompanying drawings wherein:

FIGS. 6 and 6A illustrate two different waveshape output signals obtainable with the sensing instruments shown in FIGS. 2, 5 and 5A;

FIG. 7 is a plot of the output voltage versus input current for sensors of the type shown in FIGS. 2, 5 and 5A;

FIG. 8 illustrates a wheatstone bridge form of sensing circuit according to the invention whereby variations in changes in resistance of the ferrite members due to changes in temperature can be nulled out to obtain a highly accurate reading with the instrument; and FIG. 9 illustrates a printed circuit form of sensor similar functionality to the discrete devices shown in FIGS. 2, 5 and 5A wherein the essential elements of the sensor, except for the bulk ferrite member, are fabricated by well known vapor deposition and/or sputtering techniques and provide thin film ferromagnetic structures which are susceptible to low unit cost and mass production manufacturing.

DETAILED DESCRIPTION OF PREFERRED EMBODIMENTS

Figure 1:
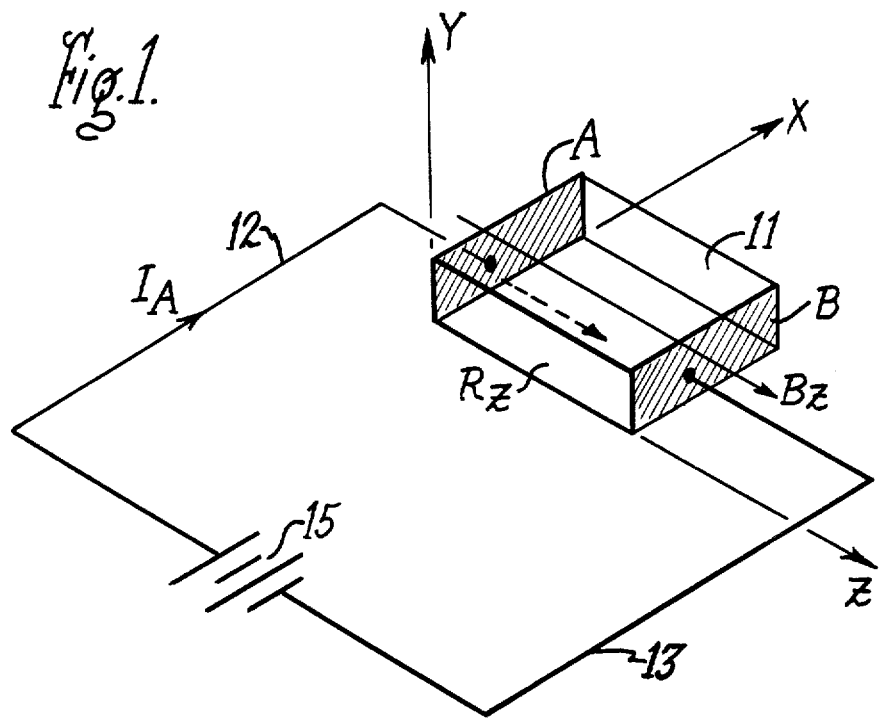
FIG. 1 is a schematic, three-dimensional illustration of a bulk ferrite members in the x, y, z plane useful in explaining anistropic magneto-resistive characteristics in ferrites.

The Hall effect is a characteristic exhibited by certain semiconductor devices wherein the resistance of the device increases with the strength of a magnetic field applied transversely across the device. Such a device is described, for example, in the textbook entitled "Structure and Applications of Galvanomagnetic Devices'—'—H. Weiss, author—published by the Pergamon Press, 1969. In contrast to the Hall effect, it has been discovered that the resistance of a ferrite member can be varied by the application of a magnetic field applied longitudinally of the member with the lines of magnetic flux of the magnetic field extending in the same direction or in an opposite direction to the current path of an electric current applied to the member simultaneously with the application of the magnetic field. It has been further observed that this anistropic magneto-resistive effect in ferrite members is larger at lower temperatures and that it disappears at the Curie temperature for the ferrite.

In the past, attempts have been made to relate the modulation of electrical conductivity in magnetic oxides with the kind and degree of carrier spin order, as reported at page 444 in the textbook entitled "Magnetic Oxides" Part 1—D. J. Craik, editor—published by John Wiley, 1975. Theoretical treatments based upon spin-direction dependent mobilities have generally predicted anomalies in resistivities and magneto-resistance coefficients near the magnetic disorder temperature (Curie temperature) as discussed in the above-noted magnetic oxide textbook. The question of the relation between carrier spin alignment and electrical conduction is extremely complex and has not yet been explained satisfactorily. It has been predicted that an anomaly in the conductivity of metal oxides, occurs near the magnetic transformation temperature and that the result of spin order is generally to lower the electrical resistivity. Further, it was reported by T. Kasuya in the "Proceedings of Theoretical Physics", Japan (1956) pages 60, 58 that near the Curie temperature, the advent of magnetic order causes a reduction in scattering of carriers as the disorder due to spin-direction-dependent interaction potential is removed. A drop in resistivity proportional to the square of the reduced sublattice magnetization which sets well below the Curie temperature in some nickel-iron ferrites was reported in the "Proceedings of the International Conference on Ferrites", Japan (July 1970) at page 591 by R. Parker and J. Tinsley. However, the effect of a longitudinal magnetic field on the DC resistance of a ferrite member at room temperature has not been reported previously insofar as presently known.

In U.S. Pat. No. 3,771,044, issued Nov. 6, 1973 for a "Broad Band Frequency Doubler and Limiter Utilizing Magneto-Resistive Effect in a Rotating Magnetic Field" by Leonard D. Cohen and Brian A. Shortt, an apparatus for frequency doubling and limiting over a broad band of frequencies by using a magneto-resistive effect in a magnetic film, is described. The apparatus includes a thin plate of magneto-resistive, ferromagnetic material immersed in an electronically generated rotating magnetic field. In the apparatus a longitudinal Hall effect is used rather than the transverse effect mentioned earlier in this specification. The apparatus employs a ferromagnetic device which is constructed by depositing a ferromagnetic film of magneto-anistropic resistive material on a substrate of suitable non-conductive material. The ferromagnetic film is deposited on the substrate by conventional evaporation or sputtering processes and may be any material that has or demonstrates (at the time of filing U.S. Pat. No. 3,771,044) ferromagnetic anistropic resistive properties such as iron, nickle, cobalt and manganese or alloys of these materials such as permalloy. It has long been known that these materials and in particular permalloy exhibit anistropic magneto-resistive characteristics.

FIG. 1 is a schematic illustration of a bulk ferrite member 11 having a longitudinal axis extending along the z axis of the block 11 having x, y and z axes as illustrated in FIG. 1. By means to be described hereinafter, the block ferrite member 11 is exposed to a magnetic field having a field strength $B_z$ wherein the magnetic lines of flux extend axially along the z or longitudinal axis of the ferrite member 11 as shown by the arrow labeled $B_Z$. The ends of the ferrite member 11 A and B through which the magnetic lines of flux $B_Z$ extend provide ohmic contacts for a set of conductors 12 and 13 for applying electric current flow through the ferrite member 11 along the longitudinal axis of the member in the same direction or in the opposite direction of the lines of magnetic flux $B_Z$, as depicted by the dotted line arrow within member 11. The set of ohmic contacts A and B on the ends of member 11 provide for connection of ferrite member 11 via the conductors 12 and 13 to a source of constant current 15 which may comprise a battery.

It has been demonstrated that variation of the DC-resistance of a ferrite member such as 11 shown in FIG. 1 exposed to a longitudinally applied magnetic field as shown in $B_Z$ in FIG. 1, can be obtained by variation of the field strength of the magnetic field with the ferrite member operating below its Curie temperature. In a specific embodiment, the ferrite employed was a manganese-zinc ferrite having an initial permeability $\mu_{ro}=2700$, a saturation flux density $B_S \geq 4,400$ gauss (0.44 Wb/m$^2$) (H = 3 Oe at 25° C.) and having a Curie temperature $T_C \geq 210°$ C. The particular manganese-zinc ferrite employed was the 3C8ferrite manufactured and sold by Ferroxcube, Inc. It is believed that the anistropic magneto-resistive effects herein described for ferrites also may be exhibited by a wide number of ferrite compositions such as nickel-iron, nickle-cobalt, nickle-zinc; magnesium-manganese; and other known bulk ferrite compositions.

It is known that ferrites are molded and fired ceramic-like devices formed from a mixture of metallic oxide powders such that the iron atoms in the cubic crystal of the ferrous ferrite are replaced by other metal atoms, such as manganese, zinc, cobalt, magnesium, nickle or the like to form a particular ferrite such as the manganese-zinc ferrite, for example. As stated earlier, the use of other ferrite compositions is believed feasible. After firing, ferrites resemble ceramic materials in appearance and physical properties and are somewhat similar to those of a doped semiconductor. The DC-resistivities of ferrites in the absence of an applied magnetic field correspond to those of semiconductors. They have magnetic permeabilities as high as 5000 and apparent dielectric constants in excess of 100,000. With an energy gap of about $E_g=0.1$ electron-volts, almost all atoms in the ferrite are ionized at room temperature. $E_g$ represents an energy which is needed to release a carrier from the atom. An activation energy of $E_g=0.094$ electron-volts was measured on the Ferrite Ferroxcube 3C8 member mentioned above. At $E_g=0.094$ eV, almost all atoms in the ferrite member are assumed to be ionized at room temperature and thus a variation of the ferrite resistance with variations in temperature in the range between $-50°$ C. to $+100°$ C. is rather related to the variation of carrier mobility with temperature rather than to variation of carrier concentration in the ferrite. It is assumed that the concentration of carriers in the ferrite member remains constant and independent of the applied longitudinal magnetic field.

Since the current $I_A$ in FIG. 1 varies with the applied longitudinal magnetic field strength $B_Z$, the lines of flux of which are oriented in the same or in the opposite direction of the current flow lines through the ferrite member, a mechanism must exist that is responsible for the carrier mobility modulation. One suggestion is that the drift mobility of carriers in Spinel ferrite members, is effected by the carrier scattering and spin alignment in the sublattice structure of the ferrite in conjunction with the movement of magnetic domain walls in such a way that the effective mobility of carriers is increased as the domain walls are oriented in the same direction upon the magnetic field being applied to the ferrite.

The current $I_A$ between the contacts A and B in FIG. 1 follows an empirical equation:

$$I_A = I_o(1 + KB^\alpha) \quad (1)$$

In this expression, B is the longitudinal magnetic flux density in the ferrite member 11 and K is a dimensional constant. $I_o$ is the current through the member 11 along the longitudinal axis for B=0. The exponent $\alpha=2$ for B=0 and $\alpha=1$ for B><0.

Figure 1A:
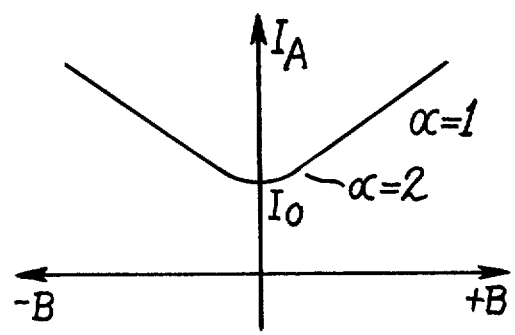
FIG. 1A is a characteristic curve showing variation in current with magnetic field strength for the arrangement of FIG. 1.
Figure 2:
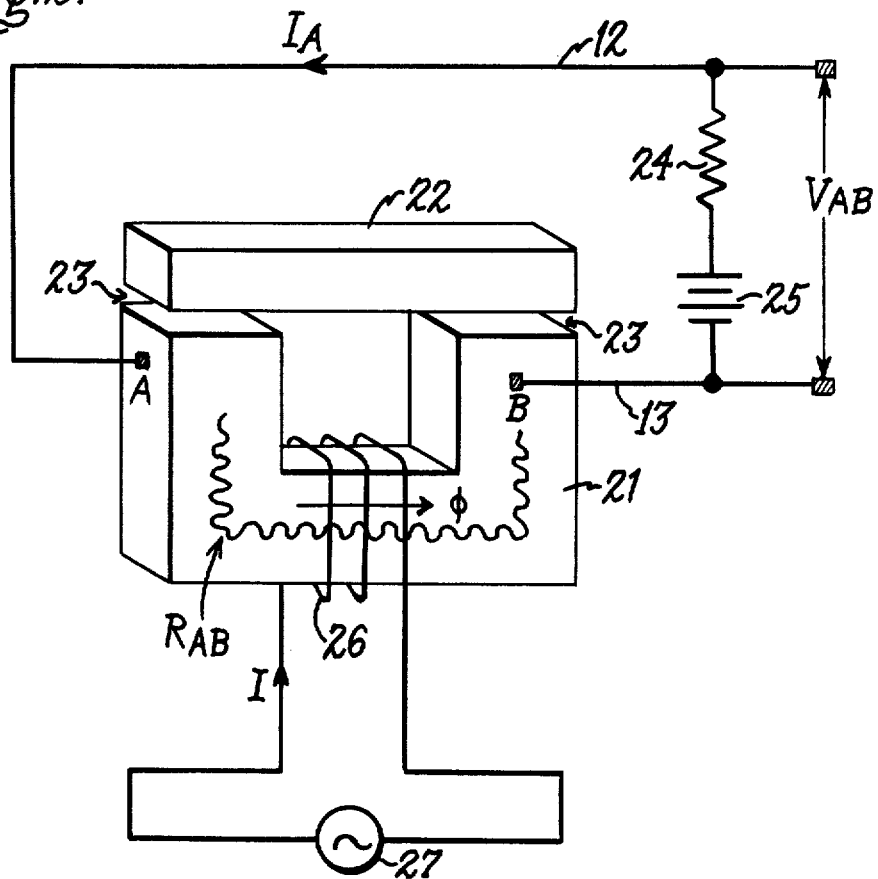
FIG. 2 is a schematic functional diagram of an electric current and/or voltage sensor constructed according to the invention.

FIG. 1A shows the characteristic plot of the value of the current $I_A$ as a function of the flux density B. The flux density B in the ferrite member in the linear region of the B(H) characteristic of the ferrite is given by the following expression:

$$B = \frac{\mu_o IN}{\frac{l}{\mu_r} + g\left(1 - \frac{1}{\mu_r}\right)} \quad (2)$$

where $\mu_o = 4\pi \times 10^{-7}$ Wb/m², $\mu_r = \Delta B/\Delta H$ is the permeability of the ferrite, l and g are the lengths of the magnetic paths of the ferrite and any air gap (if one exists) measured in meters, respectively. IN represents the ampere-windings of an electromagnetic field producing coil used to induce the longitudinal magnetic field as shown in FIG. 2 and other figures of the drawings. If the flux density B in the ferrite member reaches the saturation flux density $B_S$, then B no longer remains a linear function of the exciting current I supplied to the electromagnetic field producing coil. Therefore, upon $B = B_S$ the current $I_A$ remains nearly constant and independent of B as shown in FIG. 1A.

As will be observed from the foregoing discussion, the magneto-resistive properties exhibited by ferrite members is anistropic in nature. That is to say the variable magneto-resistive characteristic is exhibited along only one of the axes of the ferrite member. This is the longitudinal axis with respect to which the magnetic lines of flux must extend coaxially or at least in parallel and the current path likewise must extend coaxially or in parallel with the longitudinal axis either in the same direction as the magnetic lines of flux or in the opposite direction. Insofar as presently known, empirical determination of the longitudinal axis of a ferrite member is required through appropriate testing as taught in the present application. Empirical testing of a ferrite member will identify that axis of the member which exhibits the greatest variable magneto-resistive characteristics, and accordingly is the longitudinal axis which would be employed in fabricating measuring devices as described hereinafter.

FIG. 2 illustrates one known embodiment of a measuring device according to the invention. In FIG. 2 a ferrite member 21 is provided which has a generally U-shaped configuration and wherein a second ferromagnetic member 22 is provided which bridges across the ends of the U-shaped legs of ferrite member 21. Bridging member 22 may comprise another ferrite member, a piece of stainless steel, a piece of permalloy, or may be fabricated from other known ferromagnetic materials such that a high permeability, closed magnetic path is provided for bridging the legs of the U-shaped ferrite member 21. Between the ends of the U-shaped legs of ferrite member 21 and the bridging member 22, an air gap 23 is included. Ohmic contacts A and B are attached near the ends of the legs of U-shaped ferrite member 21 for connection to conductors 12 and 13. Conductors 12 and 13 are in turn connected through a resistor 24 across the terminals of a source of constant current DC 25 which may comprise a battery. To complete the device an electromagnetic field producing coil 26 is wound around the saddle portion of the U-shaped ferrite member 21 having N turns and is supplied with an alternative current I from a source of alternating current electric potential 27.

Figure 3:
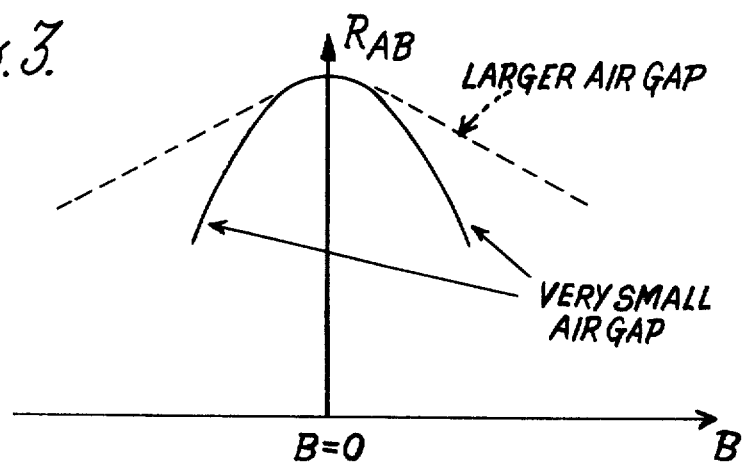
FIG. 3 is a characteristic curve plotting the change in resistivity versus change in magnetic field strength for the sensor shown in FIG. 2.
Figure 4:
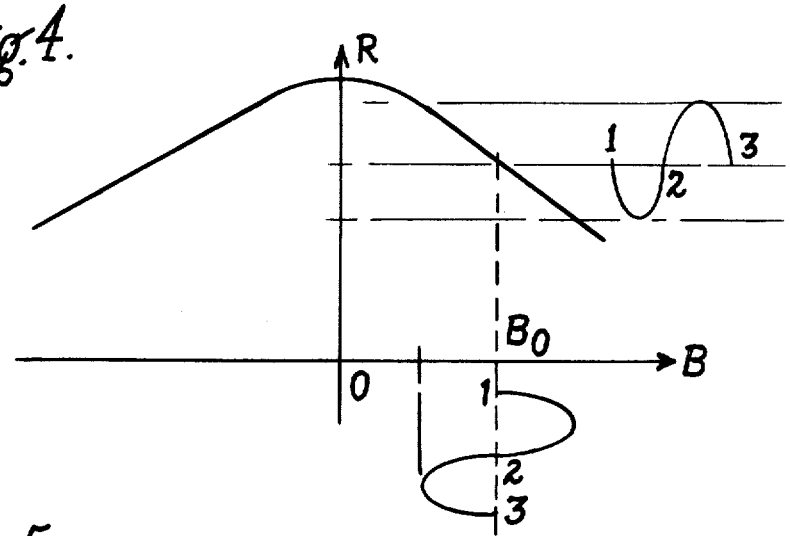
FIG. 4 is a characteristic curve similar to that shown in FIG. 3 but illustrates the effect of applying a small bias magnetic field to the sensor whereby operation over a desired portion of the B-R characteristic of the sensor can be obtained.

With the device shown in FIG. 2, the air gap 23 between the ends of the U-shaped ferrite member 21 and the ferromagnetic bar 22 determines the flux density B of the magnetic lines of flux threading the ferrite member 21 between the ohmic contact points A and B in conjunction with the direct current $I_A$ supplied therethrough from constant current source 25. It has been shown that the ohmic resistance $R_{AB}$ exhibited by ferrite member 21 between contact points A and B is a function of the flux density B and that the value of the resistance $R_{AB}$ decreases with increased magnetic flux density B regardless of the polarity (i.e., direction) of the lines of magnetic flux. If the air gap 23 is very small, then the characteristic $R_{AB}$ versus B of the measuring circuit, has approximately a square law response. By increasing the air gap 23, $R_{AB}$ becomes a more linear function of B as shown in FIG. 3 of the drawings. The effect can be used as a DC or AC-current sensor by using a biased field $B_O$ as shown in FIG. 4 of the drawings. Operation in this manner can be achieved if the member 22 in FIG. 2 is a permanent magnet, or if the ferrite member 21 in FIG. 2 is DC-magnetized or if a separate winding is used to provide a DC bias field. With the arrangement shown in FIG. 2, the value of the alternating current I supplying the coil 26 can be sensed by measuring the voltage $V_{AB}$ appearing across the fixed resistor 24 and the constant current source 25. At low current I and with the flux density $B < B_S$, the voltage $V_{AB}$ would be a sinusoidal signal of twice the frequency of the current I because of the parabolic characteristic of the device ($\alpha = 2$) at low B as shown in FIG. 1A of the drawings and in equation (1). An air gap of about 0.2 mm will provide operation in this region. When I is increased, the flux density B in the ferrite member starts to exceed the saturation flux density $B_S$ and will result in distortion of the signal $V_{AB}$. $V_{AB}$ remains almost unchanged by further increases of I for B>B_S. The saturation effect can be reduced by increasing the air gap.

Figure 5:
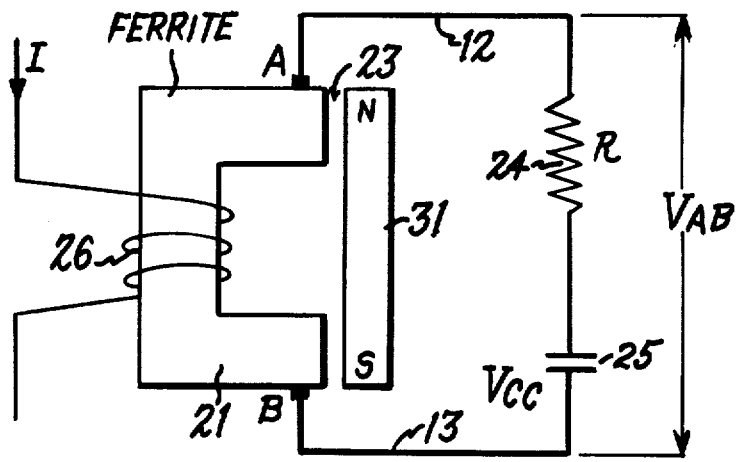
FIGS. 5 and 5A illustrate different forms of a sensing instrument according to the invention whereby biased operation in the manner illustrated by the characteristic curve of FIG. 4, can be obtained.
Figure 5A:
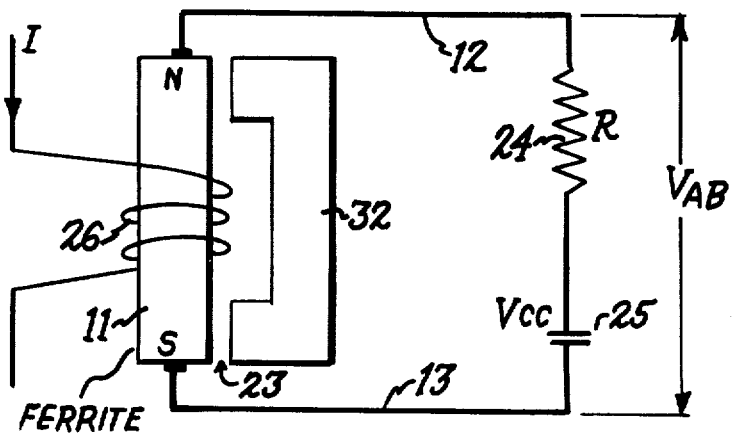

FIG. 5 and FIG. 5A illustrate alternative arrangements of the measurement device shown in FIG. 2 whereby a bias magnetic field $B_O$, the effect of which is illustrated in FIG. 4, can be provided. In FIG. 5, the U-shaped ferrite member 21 has the ends of the legs thereof bridged by an elongated, rectangular permanent magnet 31 which may be alnico or some other permanent magnet material. In FIG. 5A an elongated rectangular or cylindrically shaped ferrite member 11 is employed and the electromagnet field producing coil 26 is wound around the central portion of member 11 with the ohmic contacts A and B being formed on the respective opposite ends of the member. A U-shaped ferromagnetic member 32 is provided which may be formed from ferrite, permalloy, stainless steel or other known ferromagnetic material with the ends of the U-shaped member being spaced apart from the ferrite member 11 by the air gap 23. In operation, the arrangements of FIGS. 5 and 5A are quite similar to that described with relation to FIG. 2 and hence further description is believed unnecessary.

Waveforms of the AC current I and of the resultant output voltage signal $V_{AB}$ are shown in FIGS. 6 and 6A. A ferrite member comprising the Ferroxcube, Inc. ferrite composition IF30-3C8 was employed in the measuring circuit arrangement such as shown in FIG. 5 with the electromagnetic field producing coil 26 having twenty turns. In FIG. 6 is shown the resultant output signal $V_{AB}$ produced by an applied input alternating current signal I and FIG. 6A illustrates the resulting waveform of the output signal $V_{AB}$ where the input current is first rectified to provide a half-wave rectified exciting current I to coil 26. The phase of the output signal $V_{AB}$ shown in FIGS. 6 and 6A can be reversed by reversing of the polarity of the permanent magnet or by reversing the polarity of the exciting current I. The waveform of the output signal $V_{AB}$ can be improved by the use of a push-pull driving connection for exciting electromagnetic field producing coil 26. These results were obtained with the ferrite member maintained substantially at ambient room temperature. During later testing, the sensing circuit of FIG. 5 was exposed to a high temperature test close to the Curie temperature for the ferrite member 11. At this temperature, the ferrite becomes diamagnetic. Thus, at a temperature T of approximately 200° C. which is close to the Curie temperature $T_C = 220°$ C. for the Ferroxcube 3C8 ferrite composition, the output signal $V_{AB}$ dropped substantially to zero and was undetectable. The exciting alternating current I supplied to coil 26 during the high temperature testing was equal to 5 amperes.

FIG. 7 is a plot of the output signal $V_{AB}$ for various values of input exciting current I supplied to the coil 26 of the measuring circuit arrangement shown in FIG. 5. This plot was obtained for a Ferroxcube, Inc. ferrite composition IF30-3C8 operated at a room temperature of about 25° C. To obtain operation in this manner, proper contacting of the ferrite member is essential. Erratic change of the resistance between the contacts A and B was observed on samples where the surface of the ferrite was not ground down before application of a silver epoxy contact material. In a ferrite the bulk resistance can be different from the surface resistance due to oxidation during the cooling period. Also, sintering and firing can cause surface resistivity changes. For best results, the ferrite surface should be ground and etched clean before proceeding with formation of the ohmic contact to the member.

It is known that a ferrite has a negative temperature coefficient. In order to compensate for variation in temperature effects on the output measurements obtained with a measurement device according to the invention, FIG. 8 of the drawings illustrates an arrangement wherein a wheatstone bridge configuration is used. As shown in FIG. 8, two ferrite members 11A and 11B are connected in series circuit relationship in two adjacent arms of the bridge with two fixed resistors $R_1$ and $R_2$ being connected in series circuit relationship in the two remaining adjacent arms of the bridge. An exciting current I to be measured is supplied to the coils 26 of the respective ferrite members 11A and 11B. It should be noted that the ferrite members 11A and 11B are provided with a permanent field bias with the field bias of one member opposing the field bias of the other. It is assumed that the fixed resistors $R_1$ and $R_2$ have the same temperature coefficient and that the supply voltage from the battery 12 remains independent of changes in temperature assuming that both $R_1$ and $R_2$ are temperature stable. By this arrangement, changes in resistance of the ferrite members 11A and 11B represented by the $\Delta R_{11A}$ and $\Delta R_{11B}$ will affect the output signal in opposite directions whereby $\Delta R_{11A}$ (I) will oppose and cancel out substantially the effect of $\Delta R_{11B}$ (I). The output signal $V_{AB}$ obtained across the opposed measurement terminals of the bridge then should be substantially independent of the effect of changes in temperature on the measurement readings obtained with the ferrite sensors.

FIG. 9 illustrates a current sensor according to the invention which is fabricated by either thick film or thin film techniques. In the arrangement of FIG. 9, a ceramic substrate 41 is provided on which a ferrit film 42 is formed in accordance with known ferrite fabrication methods. After firing of the ferrite film 42, an insulating film 43 is formed over the exposed upper surface of the ferrite film 42 with the thickness of the insulator film 43 being gauged to provide a desired gap spacing similar to the air gap 23 provided in the embodiments of the invention shown in FIGS. 2, 5 and 5A. Thereafter, a strip conductor 44 is secured or otherwise formed over the insulating surface 43 and a shallow U-shaped permanently magnetized ferromagnetic member 45 that may be preformed is supported over the conductor 4 with the U-shaped ends thereof secured to the upper surfaces of the insulating film 43 in a manner so as to straddle, but not contact, the conductor strip 44. Both the insulating layer 43 and the conductor strip 44 may be fabricated by known vapor deposition or sputtering techniques well known in the thick film and/or thin film fabricating art. To complete the structure, ohmic contacts A and B are provided on the sides of the ferrite film 42 to provide for application of the measuring electric current therethrough via conductors 12 and 13 connected to ohmic contacts A and B. In operation, the arrangement of FIG. 9 will function similar to the FIG. 5A system with the notable exception that the fixed field bias is provided by magnetizing the U-shaped ferromagnetic bridging member 45. In order to reduce weight of the overall integrated circuit structure, the bridging member 45 can also be fabricated of ferrite and permanently DC magnetized to provide the desired field bias.

Due to the large variety of known ferrite compositions, it is unlikely that the anistropic magneto-resistance effect described above with respect to manganese-zinc ferrite compositions, will be found, at least to the same extent to exist in all ferrites generally. The magneto-resistance effect observed to exist in ferrites, however, is not believed to be related to the Hall-effect although the physical mechanism of conductivity modulation in ferrites is not fully understood. Experimental results thus far indicate that the geometry of the ferrite member is not critical to the magnitude of the magneto-resistance effect obtained. A resistance variation of about 0.7% to 1% at 0.2 Wb/m$^2$ is typical at room temperatures regardless of the geometry of the ferrite member. As noted with respect to the description of FIG. 8, the temperature coefficient of ferrites is strongly negative although this characteristic can be compensated for in suitably designed measurement circuits. The accuracy of DC measurements obtained with the device is affected by remanent flux density in the ferrite member employed as a sensor; however, AC measurements have been found to be quite repeatable. The utilization of the magneto-resistance effect in ferrites to provide a wide number of relatively low cost, medium accuracy sensor and measurement applications is believed evident from the present disclosure wherein all of the embodiments described can be employed as current and/or voltage transducers and measurement devices. The embodiment of the invention shown in FIG. 1 can be employed as a magnetic field probe (magnetometer) simply by inserting the ferrite member in a magnetic field to be measured so that the member is oriented longitudinally with respect to the lines of flux of the magnetic field to be measured. Other device applications wherein the anistropic magneto-resistance effect of ferrites can be employed practically and economically, also are feasible.

Other applications, variations and changes in the embodiments of the invention will become obvious to those skilled in the art in the light of the above teachings. It is therefore to be understood that any such changes, variations and applications are considered to come within the scope of the present invention as defined by the appended claims.

I claim:

1. A sensor comprising:
    a member of ferromagnetic ferrite material having anistropic magneto-resistive properties wherein the resistivity characteristics of the ferrite member vary in response to variations in the strength of a magnetic field applied longitudinally with respect to a selected longitudinal axis of the ferrite member;
    means for impressing a magnetic field on the ferrite member which is indicative of a physical phenomenon to be measured with the magnetic lines of flux extending along a longitudinal axis of the ferrite member which exhibits variable magneto-resistive properties;
    means for causing a flow of electric current through the said longitudinal axis of the ferrite member along a current path that extends in the same direction or opposite to the direction of the magnetic lines of flux; and
    output means coupled to measure changes in the resistivity characteristics of the ferrite member as in indication of the value of a physical phenomenon being measured.

2. A sensor according to claim 1 wherein the means for impressing a magnetic field on the ferrite member comprises an electrical conductor disposed adjacent to the ferrite member for electromagnetically inducing a magnetic field having lines of flux extending along the said longitudinal axis and the output means measures changes in the electric current flow through the ferrite member to provide an indication of the value of the current flowing in the electrical conductor as the physical phenomenon being measured.

3. A sensor according to claim 2 wherein the current flowing in the conductor is indicative of the voltage value of a voltage source comprising the physical phenomenon being measured.

4. A sensor according to claim 1 wherein the means for impressing a magnetic field on the ferrite member is an extraneous magnetic field existing in space externally of the sensor and comprising the physical phenomenon being measured and the electric current flow supplied to the ferrite member is maintained constant whereby the voltage appearing across the ferrite member is indicative of the magnetic field strength of the extraneous magnetic field.

5. A sensor according to claim 1 wherein the ferromagnetic ferrite member is generally U-shaped in configuration with the ends of the U-shaped legs forming pole pieces and the axial path through the end of one of the legs around the U-shaped body of the ferrite member and out the end of the remaining leg constitutes the said longitudinal axis of the ferrite member which exhibits variable magneto-resistive properties, and said sensor further includes a relatively flat rectangular-shaped magnetically susceptible member extending between the ends of the U-shaped legs of the U-shaped ferrite member and disposed with the ends thereof opposite the ends of the U-shaped legs and defining at least one gap in the magnetic field path through the two members, a set of ohmic contacts connecting respective conductors to said output means to respective outside surfaces of said U-shaped ferrite member near the ends of the legs thereof, and a magnetic field producing conductor comprising the means for impressing a magnetic field adjacent to one of the two members for producing magnetic lines of flux extending along the said longitudinal axis of said U-shaped ferrite member into and through said relatively flat rectangular-shaped magnetically susceptible member and across the gap to form a closed magnetic path.

6. A sensor according to claim 5 wherein the extent of the gap is proportioned to adjust the change in resistance versus change in magnetic field strength characteristics of the sensor to a desired extent.

7. A sensor according to claim 6 wherein the magnitude of the current supplied to and flowing through the magnetic field producing conductor is the physical phenomenon to be measured by the sensor.

8. A sensor according to claim 7 wherein the current flowing in the magnetic field producing conductor is indicative of the voltage value of a voltage source being measured.

9. A sensor according to claim 6 wherein the relatively flat rectangular-shaped magnetically susceptible member comprises a non-polarized ferrite member.

10. A sensor according to claim 6 wherein the relatively flat rectangular-shaped magnetically susceptible member comprises a permanent magnet for providing a bias to the resistance versus magnetic field strength characteristics of the sensor.

11. A sensor according to claim 6 wherein the U-shaped ferrite member is direct current magnetized to provide a bias to the resistance versus magnetic field strength characteristics of the sensor.

12. A sensor according to claim 6 wherein the U-shaped ferrite member is provided with a direct current excited bias magnetic field producing coil to provide a bias to the resistance versus magnetic field strength characteristics of the sensor.

13. A sensor according to claim 1 wherein the ferromagnetic ferrite member is generally elongated and straight in configuration with the longitudinal axis thereof constituting the said longitudinal axis of the ferrite member which exhibits variable magneto-resistive properties, and said sensor further includes a generally U-shaped magnetically susceptible second member having the ends of the legs thereof disposed opposite respective ends of the generally elongated first ferrite member to define a closed magnetic path including at least one gap in the magnetic path through the two members, a magnetic field producing conductor disposed adjacent one of the two members comprising the means for impressing the magnetic field for producing magnetic lines of flux extending along the said longitudinal axis of said elongated ferrite member into and through the generally U-shaped magnetically susceptible member and across the gap to form a closed magnetic path, and a set of ohmic contacts connecting respective conductors to said output means to respective ends of the elongated ferrite member.

14. A sensor according to claim 13 wherein the extent of the gap is proportioned to adjust the change in resistance versus change in magnetic field strength characteristics of the sensor to a desired extent.

15. A sensor according to claim 14 wherein the magnitude of the current supplied to and flowing through the magnetic field producing conductor is the physical parameter to be measured by the sensor.

16. A sensor according to claim 15 wherein the current flowing in the magnetic field producing conductor is indicative of the voltage value of a voltage source being measured.

17. A sensor according to claim 14 wherein the generally U-shaped magnetically susceptible second member comprises a ferrite member that may be either polarized or non-polarized.

18. A sensor according to claim 14 wherein the generally U-shaped second member comprises a permanent magnet for providing a bias to the resistance versus magnetic field strength characteristics of the sensor.

19. A sensor according to claim 14 wherein the generally elongated straight ferrite member is direct current magnetized to provide a bias to the resistance versus magnetic field strength characteristics of the sensor.

20. A sensor according to claim 14 wherein the generally elongated straight ferrite member is provided with a direct current excited bias magnetic field producing coil to provide a bias to the resistance versus magnetic field strength characteristics of the sensor.

21. A physical phenomenon measuring instrument employing at least two sensors according to claim 1 wherein the ferrite members comprising the respective sensors are permanently magnetized to provide a permanent field bias and wherein the arrangement is further characterized by connecting the two sensors as respective adjacent arms in a wheatstone bridge measuring circuit with a set of two fixed resistors as the respective remaining two arms, each of said two fixed resistors having a fixed temperature coefficient of resistance which does not vary with changes in temperature, the two ferrite members of the respective sensors being connected in adjacent legs of the wheatstone bridge measuring circuit in a manner such that the permanent field bias of one ferrite member opposes the permanent field bias of the other, the means for impressing a magnetic field on the ferrite members comprising respective magnetic field producing coils wound about the respective ferrite members and supplied in common with an electric current whose magnitude is the physical phenomenon to be measured, the means for causing a flow of electric current through the respective ferrite members along the longitudinal axis thereof comprising a constant current source connected between the juncture of the two ferrite members and the juncture of the two fixed resistors of the bridge and the output means comprising output terminals connected to respective ones of the junctures of each ferrite member with a fixed resistor in an adjacent bridge arm whereby output measurements of the value of the current supplied to the field producing coils is obtained and variations due to changes in resistivity of the ferrite members due to changes in temperature are cancelled out.

22. A measuring instrument according to claim 21 wherein the electric current supplied in common to the magnetic field producing coils wound on respective ferrite members is indicative of the voltage value of a voltage source comprising the physical phenomenon to be measured.

23. A sensor according to claim 13 wherein the generally elongated straight ferrite member is also flat and planar and formed on an insulating support member, an insulating surface is formed over the remaining surface of the ferrite member opposite the insulating support member, the generally U-shaped magnetically susceptible second member has the legs secured to said insulating surface and said magnetic field producing conductor comprises a relative flat conductive path formed over the said insulating surface underneath the inverted U-shaped magnetically susceptible member between the legs thereof to thereby form an integrated circuit sensor.

24. A sensor according to claim 23 wherein the generally U-shaped second magnetically susceptible manner comprises a second ferrite member.

25. A sensor according to claim 23 wherein the generally U-shaped second member comprises a permanent magnet for providing a bias to the resistance versus magnetic field strength characteristics of the sensor.

26. A sensor according to claim 23 wherein either the ferrite member or the generally U-shaped magnetically susceptible member is direct current magnetized to provide a bias to the resistance versus magnetic field strength characteristics of the sensor.

27. A sensor according to claim 1 further including a second ferromagnetic member with said second ferromagnetic member and said ferrite member being configured to form a high permeability closed magnetic path including a gap, and wherein said means for impressing a magnetic field on the ferrite member comprises magnetic field producing conductor means adjacent to one of the two members for producing magnetic lines of flux extending along the said longitudinal axis of said ferrite member through said high permeability closed magnetic path and across the gap.

28. A sensor comprising:
a member of ferromagnetic ferrite material having anistropic magneto-resistive properties wherein the resistivity characteristics of the ferrite member vary in response to variations in the strength of a magnetic field applied longitudinally with respect to a selected longitudinal axis of the ferrite member;

means for impressing a magnetic field on the ferrite member with the magnetic lines of flux extending along a longitudinal axis of the ferrite member which exhibits variable magneto-resistive properties;

a constant current source of electric current connected to said ferrite member for causing a flow of electric current through the said longitudinal axis of the ferrite member along a current path that extends in the same direction or opposite to the direction of the magnetic lines of flux; and output means coupled to measure changes in resistivity of the ferrite member as an indication of the field strength of the magnetic field.

29. A method for utilizing the anistropic magneto-resistive properties of a ferromagnetic ferrite member for measuring physical properties such as current, voltage, magnetic field strength and the like; said method comprising:

impressing a magnetic field across the ferrite member with the magnetic lines of flux extending along a longitudinal axis of the ferrite member whose resistivity characteristics vary in response to variations in the strength of the applied magnetic field;

applying an electric current flow through the ferrite member along a current path that extends along the said longitudinal axis either in the same direction or in an opposite direction to the direction of the magnetic lines of flux;

and measuring the changes in resistivity of the ferrite member induced by the physical property to be measured as an indication of the value of the physical property.

30. A method according to claim 29 wherein the magnetic field impressed across the ferrite member is produced by an electromagnetic field producing conductor having a current supplied thereto the magnitude of which is to be measured.

31. A method according to claim 30, wherein the current flowing in the conductor is indicative of the voltage value of a voltage source to be measured.

32. A method according to claim 29 wherein the magnetic field impressed across the ferrite member is an extraneous magnetic field existing in space externally of the sensor and the current flow to the ferrite member is maintained constant whereby the voltage appearing across the ferrite member is indicative of the magnetic field strength of the extraneous magnetic field.

* * * * *